United States Patent
Sato et al.

(10) Patent No.: US 7,141,466 B2
(45) Date of Patent: Nov. 28, 2006

(54) METHOD OF FABRICATING SEMICONDUCTOR DEVICE HAVING GATE INSULATING FILM COMPRISING A SILICATE NITRIDE FILM WITH INTERFACE INSULATING FILM

(75) Inventors: Motoyuki Sato, Kanagawa (JP); Kazuhiro Eguchi, Kanagawa (JP); Seiji Inumiya, Kanagawa (JP); Katsuyuki Sekine, Kanagawa (JP); Akio Kaneko, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 72 days.

(21) Appl. No.: 10/962,673

(22) Filed: Oct. 13, 2004

(65) Prior Publication Data

US 2005/0236678 A1   Oct. 27, 2005

(30) Foreign Application Priority Data

Apr. 27, 2004  (JP) .............................. 2004-131523

(51) Int. Cl.
  *H01L 21/336* (2006.01)
  *H01L 21/8234* (2006.01)
(52) U.S. Cl. ....................... 438/197; 438/287
(58) Field of Classification Search ................ 438/197, 438/287
  See application file for complete search history.

(56) References Cited

U.S. PATENT DOCUMENTS

| 7,091,135 | B1* | 8/2006 | Inumiya et al. ............. 438/758 |
| 2005/0106896 | A1* | 5/2005 | Fukuchi ....................... 438/778 |
| 2005/0205948 | A1* | 9/2005 | Rotondaro et al. ......... 257/411 |
| 2005/0233526 | A1 | 10/2006 | Watanabe et al. |

FOREIGN PATENT DOCUMENTS

| JP | 2000-049349 | 2/2000 |
| JP | 2002-314067 | 10/2002 |
| JP | 2003218108 | 7/2003 |
| JP | 2003-249497 | 9/2003 |
| JP | 2005-064032 | 3/2005 |
| WO | WO 2004/008544 | 1/2004 |

OTHER PUBLICATIONS

Inumiya, et al.; "Method of Manufacturing Semiconductor Device", U.S. Patent Application No. 10/789,337, filed Mar. 12, 2004.
Notification of Reason for Rejection issued by the Japanese Patent Office on May 30, 2006, for Japanese Patent Application No. 2004-131523, and English-language translation thereof.

* cited by examiner

Primary Examiner—Evan Pert
(74) Attorney, Agent, or Firm—Finnegan, Henderson, Farabow, Garrett & Dunner, L.L.P.

(57) ABSTRACT

According to the present invention, there is provided a semiconductor device comprising:

an interface insulating film selectively formed on a predetermined region of a semiconductor substrate, and having a film thickness of substantially one atomic layer;

a gate insulating film formed on said interface insulating film, and having a dielectric constant higher than that of said interface insulating film;

a gate electrode formed on said gate insulating film; and source and drain regions formed in a surface region of said semiconductor substrate on two sides of a channel region positioned below said gate electrode.

8 Claims, 2 Drawing Sheets

METHOD OF FABRICATING SEMICONDUCTOR DEVICE HAVING GATE INSULATING FILM COMPRISING A SILICATE NITRIDE FILM WITH INTERFACE INSULATING FILM

CROSS REFERENCE TO RELATED APPLICATION

This application is based upon and claims benefit of priority under 35 USC §119 from the Japanese Patent Application No. 2004-131523, filed on Apr. 27, 2004, the entire contents of which are incorporated herein by reference.

RELATED ART

The present invention relates to a semiconductor device and a method of fabricating the same.

Recently, a MISFET (Metal Insulator Semiconductor Field Effect Transistor) has the following problem that, as micropatterning progresses, the thickness of a gate insulating film for controlling the flow of an electric current decreases, and this increases a gate leakage current.

To avoid this problem, therefore, the gate leakage current is reduced by using a gate insulating film made of a high-dielectric-constant (High-k) material.

When a high-dielectric-constant gate insulating film is formed in the fabrication process of a MISFET, however, a low-dielectric-constant interface insulating film (interface layer) is formed between this high-dielectric-constant gate insulating film and a silicon substrate. This low-dielectric-constant interface insulating film lowers the dielectric constant of the gate insulating film.

The low-dielectric-constant interface insulating film has a film thickness of 0.8 to 2 [nm]. To avoid the decrease in dielectric constant of the gate insulating film, it is desirable to decrease the thickness and increase the dielectric constant of this low-dielectric-constant interface insulating film.

As a method of forming a high-dielectric-constant gate insulating film, it is possible to form a zirconium silicon nitride (ZrSiN) film on a silicon substrate, and oxidize this film to form a zirconium silicate nitride (ZrSiON) film.

In this method, however, nitrogen (N) is mixed during film formation, so this nitrogen reaches the interface of the silicon substrate. Accordingly, in a MISFET fabricated by using this method, the nitrogen present in the interface of the silicon substrate interferes with an electric current flowing in a channel region. As a consequence, the interface characteristics deteriorate, and this deteriorates the characteristics of the field effect transistor.

References related to a high-dielectric-constant gate insulating film are as follows.

Patent reference 1: Japanese Patent Laid-Open No. 2003-218108
Patent reference 2: Japanese Patent Laid-Open No. 2003-249497

SUMMARY OF THE INVENTION

According to one aspect of the present invention, there is provided a semiconductor device comprising:

an interface insulating film selectively formed on a predetermined region of a semiconductor substrate, and having a film thickness of substantially one atomic layer;

a gate insulating film formed on said interface insulating film, and having a dielectric constant higher than that of said interface insulating film;

a gate electrode formed on said gate insulating film; and
source and drain regions formed in a surface region of said semiconductor substrate on two sides of a channel region positioned below said gate electrode.

According to one aspect of the present invention, there is provided a semiconductor device fabrication method, comprising:

forming a film on a semiconductor substrate by depositing a material selected from the group consisting of a combination of a metal and silicon and, an alloy of metals;

forming a nitride film by nitriding the film by supplying nitrogen; and forming a gate insulating film by oxidizing the nitride film by supplying oxygen, and forming an interface insulating film between the gate insulating film and semiconductor substrate by oxidizing the semiconductor substrate.

DETAILED DESCRIPTION OF THE EMBODIMENTS

An embodiment of the present invention will be described below with reference to the accompanying drawings.

Figure 1:
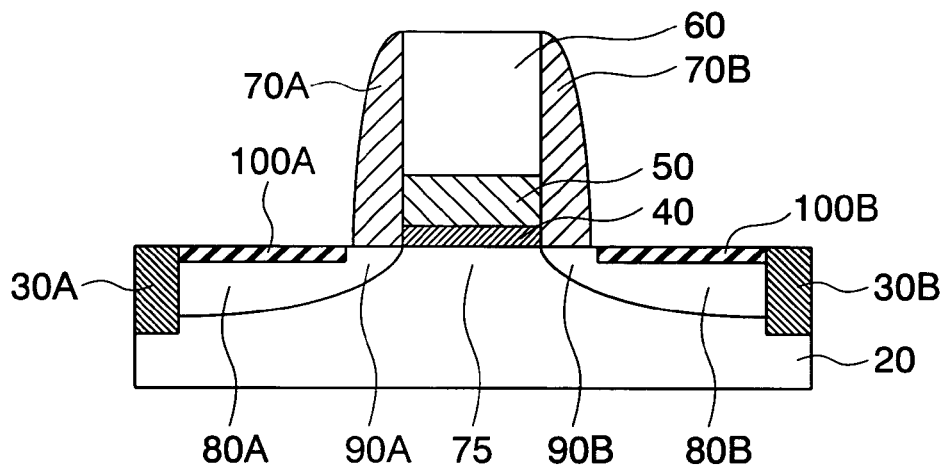
FIG. 1 is a longitudinal sectional view showing the structure of a MISFET according to an embodiment of the present invention.

FIG. 1 shows the structure of a MISFET 10 of a semiconductor device according to the embodiment of the present invention. In a surface portion of a silicon substrate 20, element isolation insulating films 30A and 30B for element isolation are formed. The MISFET 10 is formed in this element region isolated by the element isolation insulating films 30A and 30B.

In the vicinity of a central portion of the element region isolated by the element isolation insulating films 30A and 30B, a gate electrode 60 is formed on an interface insulating film 40 formed on the surface of the silicon substrate 20 and a silicon metal oxynitride film 50 stacked as a gate insulating film on the interface insulating film 40.

The interface insulating film 40 is a silicon oxide film ($SiO_2$) having a low dielectric constant and a very small film thickness. For example, the relative dielectric constant of the film is 3.9, and its film thickness is 4 to 6 [Å] which is approximately equivalent to one atomic layer of oxygen (O) atoms. Note that the interface insulating film 40 also has a portion having a film thickness equivalent to two atomic layers of oxygen (O) atoms, so the film thickness has the range of 4 to 6 [Å].

The silicon metal oxynitride film 50 is a hafnium silicate nitride (HfSiON) film having a high dielectric constant. For example, the relative dielectric constant is 8 to 22, and the total film thickness of the silicon metal oxynitride film 50 and interface insulating film 40 is 10 to 20 [Å]. Accordingly, the silicon metal oxynitride film 50 is so formed that the combination of the relative dielectric constant and film thickness falls within the range of 8 and 10 [Å] to 22 and 20 [Å].

The gate electrode 60 is made of, e.g., silicon germanium ($Si_xGe_{1-x}$ ($0 \leq x \leq 0.8$)), or silicon (Si) and a metal such as Fe, Co, Ni, Ti, Hf, Zr, or W or an alloy of any of these metals. However, it is also possible to extensively use various gate electrode materials.

On the side surfaces of the gate electrode 60, gate electrode sidewalls 70A and 70B made of an insulating film are formed. In addition, a channel region 75 in which an electric current flows is formed in a position below the gate electrode 60 and near the surface of the silicon substrate 20.

At the two ends of the channel region 75, a source extension region 90A and drain extension region 90B having shallow junctions are formed. A source region 80A is formed between the source extension region 90A and element isolation insulating film 30A. A drain region 80B is formed between the drain extension region 90B and element isolation insulating film 30B.

The junction depth of the source extension region 90A and drain extension region 90B is 20 [nm] or less. The junction depth of the source region 80A and drain region 80B is 100 [nm] or less. The impurity concentration of any of the source extension region 90A, drain extension region 90B, source region 80A, and drain region 80B is about $1.0 \times 10^{20}$ $cm^{-3}$.

Furthermore, on the surfaces of the source region 80A and drain region 80B, salicide films 100A and 100B for reducing the contact resistance of the source regions 80A and 80B, respectively, are formed.

Figure 2:
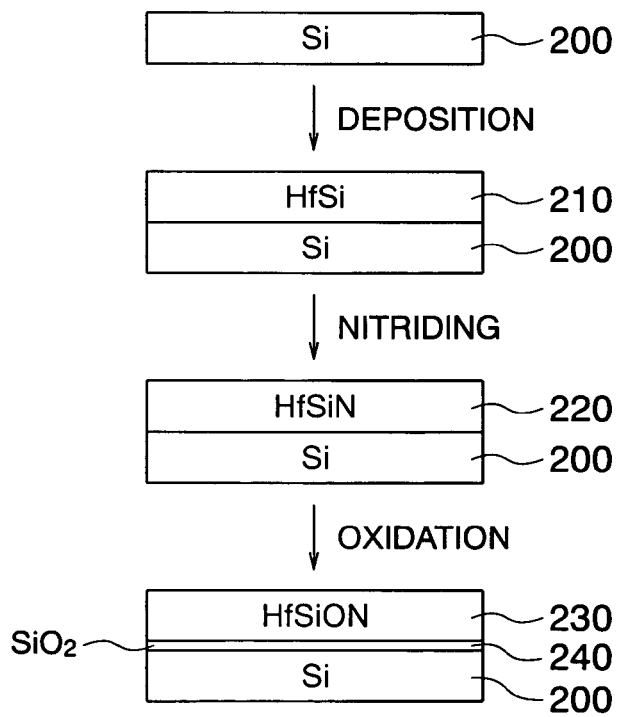
FIG. 2 is a longitudinal sectional view showing the device sectional structures in individual steps of a method of forming a gate insulating film and interface insulating film according to the embodiment of the present invention.

A method of forming a hafnium silicate nitride (HfSiON) film and silicon oxide ($SiO_2$) film as the silicon metal oxynitride film 50 and interface insulating film 40, respectively, which are gate insulating films according to this embodiment will be explained below with reference to FIG. 2. First, a silicon (Si) substrate 200 on which an element isolation insulating film is formed is prepared. A natural oxide film on the surface of the silicon (Si) substrate 200 is removed by an aqueous hydrogen fluoride (HF) solution. After that, a hafnium silicon (HfSi) film 210 which is an alloy of hafnium (Hf) and silicon (Si) is formed on the silicon (Si) substrate 200 by deposition.

Examples of the deposition method are a sputtering method, sol-gel method, vacuum evaporation method, electron beam evaporation method, molecular beam evaporation method, laser abrasion method, and CVD (Chemical Vapor Deposition) method.

The materials of hafnium (Hf) and silicon (Si) are those containing no oxygen. For example, the hafnium silicon (HfSi) film 210 is formed by supplying tetrakisdiethylaminohafnium ($Hf(N(C_2H_5)_2)_4$) as the material of hafnium (Hf) and tetrakisdimethylaminosilicon ($Si(N(CH_3)_2)_4$) as the material of silicon (Si) onto the silicon (Si) substrate 200 held at 450 to 650° C. It is also possible to use organic metal compounds containing hafnium (Hf) and silicon (Si). Other examples of the materials of hafnium (Hf) and silicon (Si) are hydrogen compounds and chlorine compounds.

In this film formation method, no oxidizing ambient is present, so it is possible to avoid the formation of any silicon oxide film ($SiO_2$) which is a low-dielectric-constant interface insulating film.

By nitriding the hafnium silicon (HfSi) film 210, a hafnium silicon nitride (HfSiN) film 220 as a silicon metal nitride film is formed on the silicon (Si) substrate 200.

Examples of this nitriding process are high-temperature processing performed in an ambient of nitrous oxide ($N_2O$), nitrogen oxide (NO), or ammonia, high-temperature processing performed in an $ND_3$ ambient in which hydrogen is replaced with heavy hydrogen, a plasma nitriding process, and a radical nitriding process.

In this process, the concentration distribution of nitrogen (N) can be controlled by mixing nitrogen (N) into the hafnium silicon (HfSi) film from above it. This makes it possible to suppress mixing of nitrogen (N) into the interface between the hafnium silicon nitride (HfSiN) film and silicon (Si) substrate, and avoid deterioration of the interface characteristics.

Figure 3:
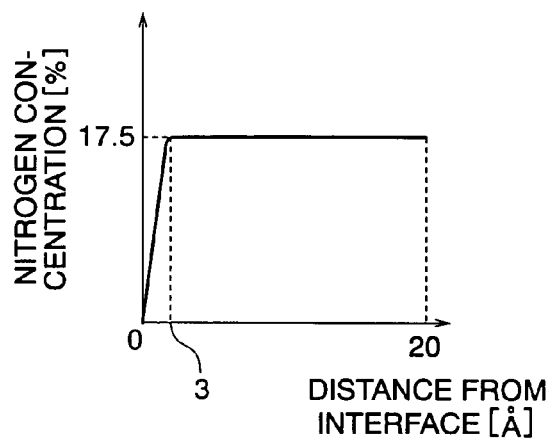
FIG. 3 is a graph showing the concentration distribution of nitrogen (N) in the gate insulating film.

FIG. 3 shows an example of the concentration distribution of nitrogen (N) in the hafnium silicon nitride (HfSiN) film 220. As shown in FIG. 3, the nitrogen concentration in the interface is about 0%. The nitrogen concentration increases as the distance from the interface increases, and becomes a predetermined value within the range of 10 to 20%, e.g., about 17.5%, when the distance from the interface exceeds 3 [Å].

Note that the heat resistance can be increased by the addition of nitrogen.

A hafnium silicate nitride (HfSiON) film 230 as a silicon metal oxynitride film is formed on the silicon substrate 200 by oxidizing the hafnium silicon nitride (HfSiN) film 220.

Examples of this oxidation process are a heating process performed in an ambient of nitrous oxide ($N_2O$), oxygen ($O_2$), or ozone, a plasma oxidation process, and a radical oxidation process.

As in the nitriding process, the concentration distribution of oxygen (O) can be controlled by mixing oxygen (O) into the hafnium silicon nitride (HfSiN) film 220 from above it. Therefore, for the purpose of improving the interface characteristics of the silicon (Si) substrate, the concentration distribution can be controlled such that oxygen (O) is present closer to the substrate by about one atomic layer than nitrogen (N).

By oxidizing the silicon (Si) substrate 200 by about one atomic layer, a silicon oxide ($SiO_2$) film 240 of about one atomic layer is formed between the hafnium silicate nitride (HfSiON) film 230 as a high-dielectric-constant gate insulating film and the silicon (Si) substrate 200.

Figure 4:
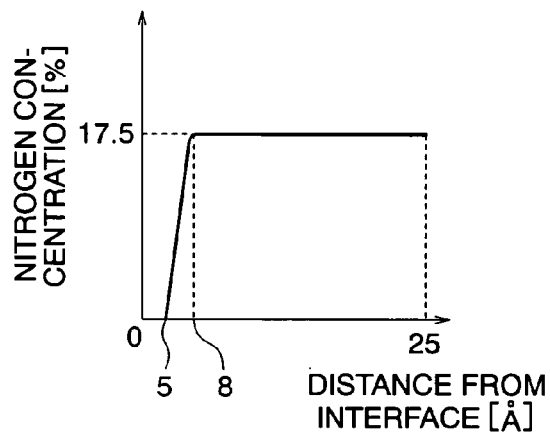
FIG. 4 is a graph showing the concentration distribution of nitrogen (N) in the interface insulating film and gate insulating film.
Figure 5:
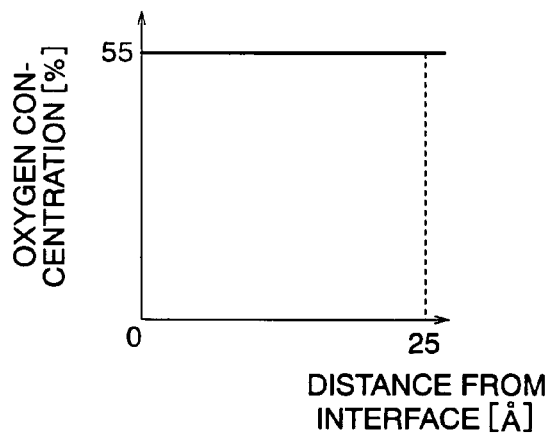
FIG. 5 is a graph showing the concentration distribution of oxygen (O) in the interface insulating film and gate insulating film.

FIG. 4 shows an example of the concentration distribution of nitrogen (N) in the silicon oxide ($SiO_2$) film 240 and hafnium silicate nitride (HfSiON) film 230. FIG. 5 shows an example of the concentration distribution of oxygen (O) in the silicon oxide ($SiO_2$) film 240 and hafnium silicate nitride (HfSiON) film 230.

As shown in FIG. 4, the nitrogen concentration is about 0% when the distance from the interface is 0 to 5 [Å], i.e., in the interface of the silicon (Si) substrate 200 and in the silicon oxide ($SiO_2$) film 240. The nitrogen concentration increases as the distance from the silicon oxide ($SiO_2$) film 240 increases, and becomes a predetermined value within the range of 10 to 20%, e.g., 17.5% when the distance from the interface exceeds 8 [Å].

As shown in FIG. 5, on the other hand, the oxygen concentration is a predetermined value within the range of 40 to 66%, e.g., 55%, regardless of the distance from the interface.

As described above, it is desirable to decrease the thickness of the silicon oxide ($SiO_2$) film as a low-dielectric-constant interface insulating film which decreases the dielectric constant of the gate insulating film. However, if this silicon oxide (SiO$_2$) film is not formed at all, the interface stability cannot be ensured, so the interface characteristics deteriorate anyway. Therefore, a silicon oxide (SiO$_2$) film 240 of about one atomic layer which is a minimum film thickness by which deterioration of the interface characteristics can be avoided is formed. This makes it possible to avoid deterioration of the interface characteristics while the dielectric constant of the gate insulating film is maintained.

After that, a gate electrode material is deposited, and this gate electrode material and the hafnium silicate nitride (HfSiON) film 230 and silicon oxide (SiO$_2$) film 240 are patterned in the order named, thereby forming a gate electrode 60, silicon metal oxynitride film 50, and interface insulating film 40 shown in FIG. 1. Finally, a MISFET 10 shown in FIG. 1 is formed by forming, in self-alignment, a source extension region 90A and drain extension region 90B, gate electrode sidewalls 70A and 70B, a source region 80A and drain region 80B, and salicide films 100A and 100B in this order.

The MISFET 10 thus fabricated can be applied to a memory or logic circuit of, e.g., a cell phone required to consume low power.

In the semiconductor device and the method of fabricating the same according to this embodiment, deterioration of the interface characteristics can be avoided while the dielectric constant of the gate insulating film is maintained.

The above embodiment is merely an example and hence does not limit the present invention. For example, zirconium (Zr) may also be used instead of hafnium (Hf). That is, it is also possible to form a zirconium silicon (ZrSi) film, nitride this zirconium silicon (ZrSi) film to form a zirconium silicon nitride (ZrSiN) film, and oxidize this zirconium silicon nitride (ZrSiN) film to form a zirconium silicate nitride (ZrSiON) film.

Also, in the above embodiment, a silicon (Si) substrate is used as a semiconductor substrate. However, the present invention is also applicable to a semiconductor substrate such as a germanium (Ge) substrate.

Furthermore, in the above embodiment, film formation is performed by depositing an alloy of hafnium (Hf) and silicon (Si) on the silicon (Si) substrate 200. In the present invention, however, film formation may also be performed by depositing an alloy of hafnium (Hf) and aluminum (Al).

The invention claimed is:

1. A semiconductor device fabrication method, comprising:
   forming a film on a semiconductor substrate by depositing a material selected from the group consisting of a combination of a metal and silicon, and an alloy of metals;
   forming a nitride film by nitriding the film by supplying nitrogen; and
   forming a gate insulating film by oxidizing the nitride film by supplying oxygen, and forming an interface insulating film between the gate insulating film and semiconductor substrate by oxidizing the semiconductor substrate.

2. A method according to claim 1, wherein said film is formed by depositing a material selected from the group consisting of a combination of a metal and silicon, and an alloy of metals on the semiconductor substrate without supplying any oxygen.

3. A method according to claim 1, wherein when the nitride film is formed, a concentration distribution of the nitrogen in the nitride film is controlled by supplying the nitrogen from above the film, such that the nitrogen does not mix in an interface between the semiconductor substrate and nitride film.

4. A method according to claim 1, wherein when the gate insulating film is formed, a concentration distribution of the oxygen in the interface insulating film and gate insulating film is controlled by supplying the oxygen from above the nitride film, such that the oxygen is positioned closer to the semiconductor substrate by substantially one atomic layer than the nitrogen.

5. A method according to claim 1, wherein the interface insulating film is so formed as to have a film thickness of 4 to 6 [Å] which is equivalent to one atomic layer.

6. A method according to claim 1, wherein the interface insulating film is made of a silicon dioxide film.

7. A method according to claim 1, wherein the nitride film is formed such that a total film thickness of the nitride film and interface insulating film is 10 to 20 [Å].

8. A method according to claim 1, wherein the gate insulating film is made of a material selected from the group consisting of a hafnium silicate nitride film and zirconium silicate nitride film.

* * * * *